(12) United States Patent
Kim et al.

(10) Patent No.: US 7,541,255 B2
(45) Date of Patent: Jun. 2, 2009

(54) METHOD FOR MANUFACTURING SEMICONDUCTOR DEVICE

(75) Inventors: Seung Bum Kim, Seoul (KR); Ki Won Nam, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/481,520

(22) Filed: Jul. 5, 2006

(65) Prior Publication Data

US 2007/0197038 A1 Aug. 23, 2007

(30) Foreign Application Priority Data

Feb. 21, 2006 (KR) .................. 10-2006-0016591

(51) Int. Cl.
*H01L 21/76* (2006.01)
*H01L 23/544* (2006.01)

(52) U.S. Cl. .................. 438/401; 438/430; 438/589; 438/592; 257/797

(58) Field of Classification Search .......... 438/259, 438/279, 401, 462, 430, 589; 257/797
See application file for complete search history.

(56) References Cited

U.S. PATENT DOCUMENTS

| 5,889,335 | A | * | 3/1999 | Kuroi et al. | 257/797 |
| 6,049,137 | A | * | 4/2000 | Jang et al. | 257/797 |
| 6,528,386 | B1 | * | 3/2003 | Summerfelt et al. | 438/401 |
| 6,534,378 | B1 | * | 3/2003 | Ramkumar et al. | 438/401 |
| 6,774,452 | B1 | * | 8/2004 | Ramkumar et al. | 257/506 |
| 6,939,777 | B2 | | 9/2005 | Ohto et al. | |
| 2002/0151183 | A1 | * | 10/2002 | Yang et al. | 438/714 |
| 2006/0197237 | A1 | * | 9/2006 | Machida et al. | 257/797 |

FOREIGN PATENT DOCUMENTS

KR 100155835 B1 7/1998
KR 1020010064079 A 7/2001

* cited by examiner

*Primary Examiner*—David Vu
*Assistant Examiner*—Earl N Taylor
(74) *Attorney, Agent, or Firm*—Townsend and Townsend and Crew LLP

(57) ABSTRACT

A method for manufacturing a semiconductor device includes forming a key open mask for coating a cell region in order to a gate polysilicon layer over an overlay vernier region formed in a gate forming process, and removing the gate polysilicon layer of the overlay vernier region while regulating an etching process so that the overlay vernier region has a superior shape.

13 Claims, 8 Drawing Sheets

( i )

( ii )

METHOD FOR MANUFACTURING
SEMICONDUCTOR DEVICE

BACKGROUND OF THE INVENTION

The present invention relates to a method for manufacturing a semiconductor device, and more specifically, to a method of producing an overlay vernier with better alignment characteristics.

As design rule parameters of a semiconductor device decreases, it becomes more difficult to form an overlay vernier for performing an alignment process for each layer of a semiconductor device.

FIGS. 1a through 1d are cross-sectional diagrams illustrating a conventional method for forming an overlay vernier. The left side (i) represents an overlay vernier region, and the right side (ii) represents a gate formation process in a cell region. Both regions are formed simultaneously with (i) being a dummy region and (ii) being an active region.

Referring to FIG. 1a, a semiconductor substrate 10 is etched at a predetermined thickness to form a recess gate region(or a trench) 15. Simultaneously, an overlay vernier(or a trench) 25 is formed.

Referring to FIG. 1b, a gate oxide film 20 having a predetermined thickness is formed over the entire surface of the semiconductor substrate 10.

Referring to FIG. 1c, a gate polysilicon layer 30 which fills the recess gate region 15 and the overlay vernier region 25 is formed. The surface of the gate polysilicon layer 30 a concave shape (or depression) due to the step difference of the recess gate and overlay vernier regions 15 and 25 to their surrounding structures.

Referring to FIG. 1d, a gate metal layer (or a gate conductive layer) 40 and a gate hardmask layer 50 are sequentially formed over the gate polysilicon layer 30. The gate hardmask layer 50, the gate metal layer 40 and the gate polysilicon layer 30 of the cell region are patterned to form a gate. When the gate polysilicon layer 30 is formed, the step difference of the overlay vernier region 25 becomes less prominent, and the left and right edge of the overlay vernier region 25 may become unsymmetrical so that the alignment process becomes difficult to perform.

FIGS. 2a and 2b are cross-sectional images illustrating the conventional overlay vernier region.

According to the conventional method for manufacturing a semiconductor device, when the gate polysilicon layer is formed, the step difference of the overlay vernier is not as deep and the sides are gently sloped. This can make the alignment marks unclear (see FIG. 2a). The sides of the step difference of the overlay vernier can become unsymmetrical (see region (a) of FIG. 2b). As a result, overlay characteristics are degraded and yield is reduced.

SUMMARY OF THE INVENTION

Various embodiments are directed at providing a method for manufacturing a semiconductor device that form an overlay vernier with a superior shape and obtains reproducibility of the overlay vernier.

According to an embodiment of the present invention, a method for manufacturing a semiconductor device comprises of:

(a) etching a semiconductor substrate to form a recess gate region and an overlay vernier region;

(b) forming a gate oxide film over the entire surface of the semiconductor substrate;

(c) forming a gate polysilicon layer which fills the recess gate region and planarizing the polysilicon layer;

(d) removing the gate polysilicon layer formed over the overlay vernier region;

(e) forming a gate metal layer and a gate hardmask layer over the entire surface of the resulting structure; and (f) aligning the gate mask with the overlay vernier and forming a gate.

Step (d) may include a dry etching process with a key open mask which exposes the overlay vernier region. Here, an etching gas having a high etching selectivity of the gate polysilicon layer over the gate oxide film is used.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

In FIGS. 3a through 3e, the left side (i) illustrates the formation of an overlay vernier in an overlay vernier region, and the right side (ii) illustrates the formation of a gate in a cell region.

Figure 1A:
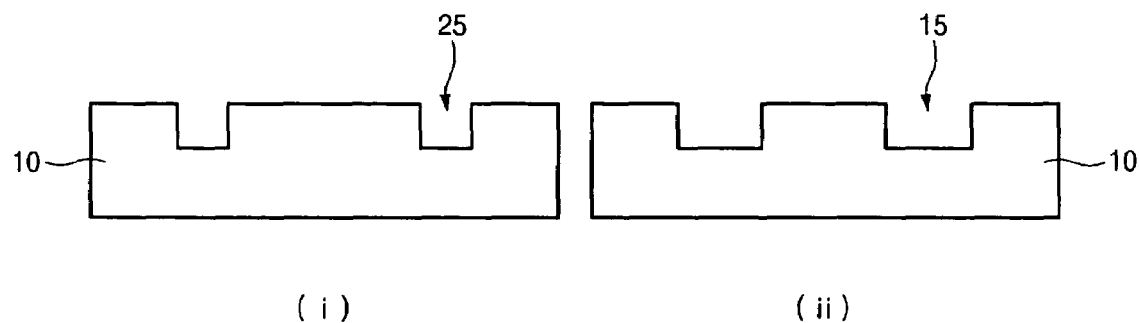
FIGS. 1a through 1d are cross-sectional diagrams illustrating a conventional method for forming an overlay vernier.
Figure 1B:
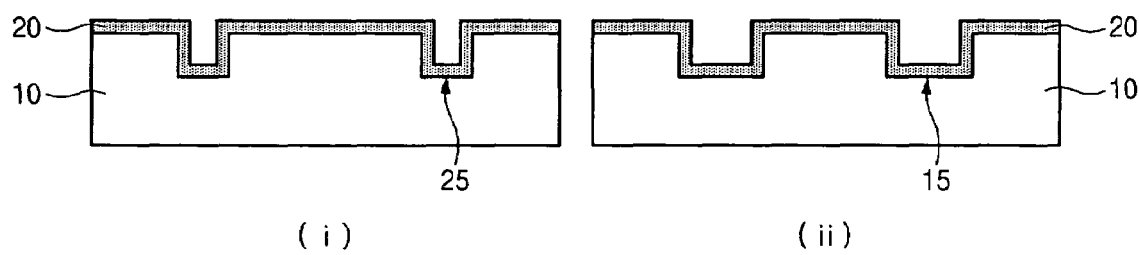
Figure 1C:
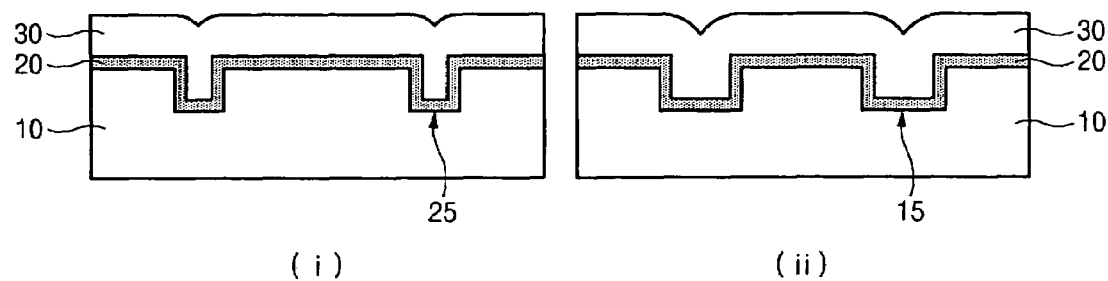
Figure 1D:
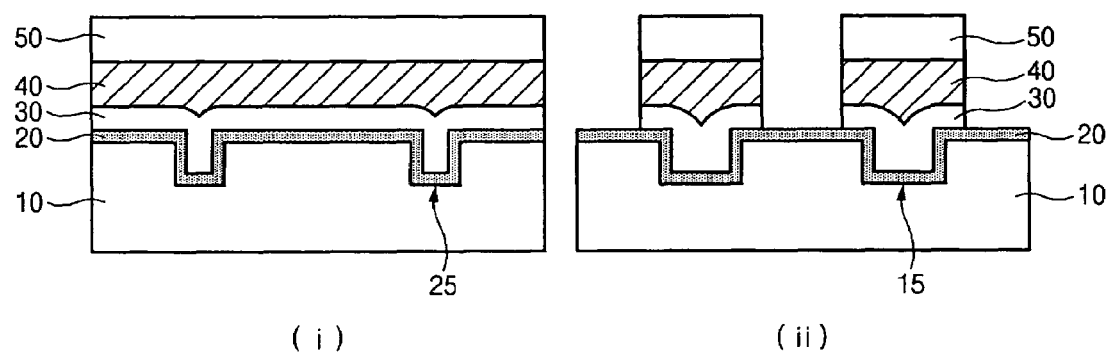
Figure 2A:
FIGS. 2a and 2b are cross-sectional images illustrating problems of a conventional overlay vernier region.
Figure 2B:
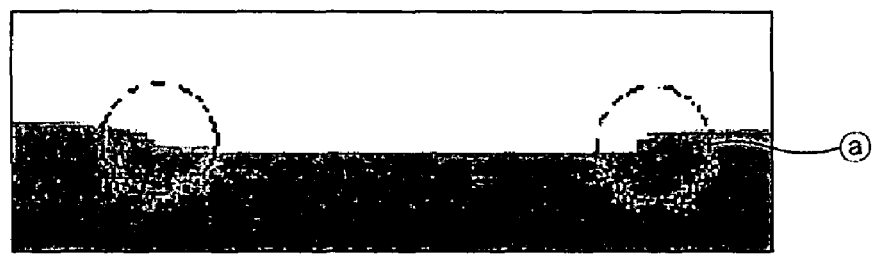
Figure 3A:
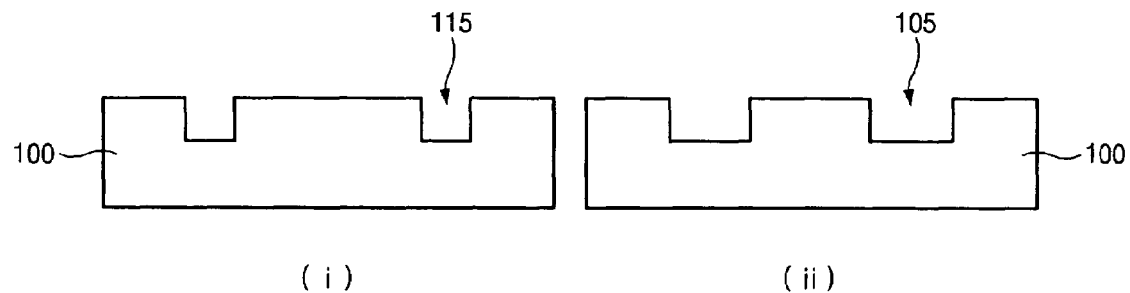
FIGS. 3a through 3e are cross-sectional diagrams illustrating a method for manufacturing a semiconductor device according to an embodiment of the present invention.

Referring to FIG. 3a, a semiconductor substrate 100 is etched at a predetermined thickness to form a recess gate region 105 and an overlay vernier region 115. These regions are trenches in the present embodiment.

Figure 3B:
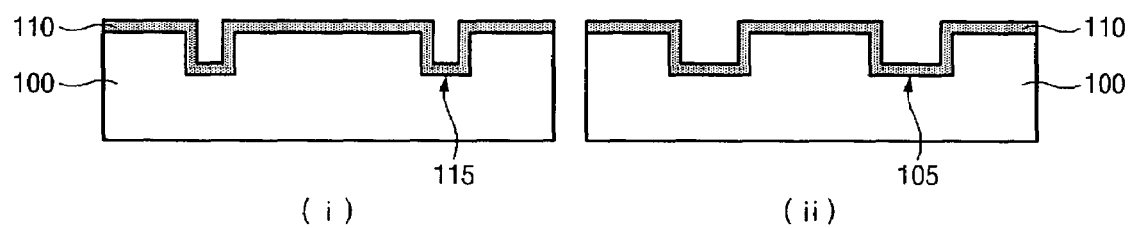
Figure 3C:
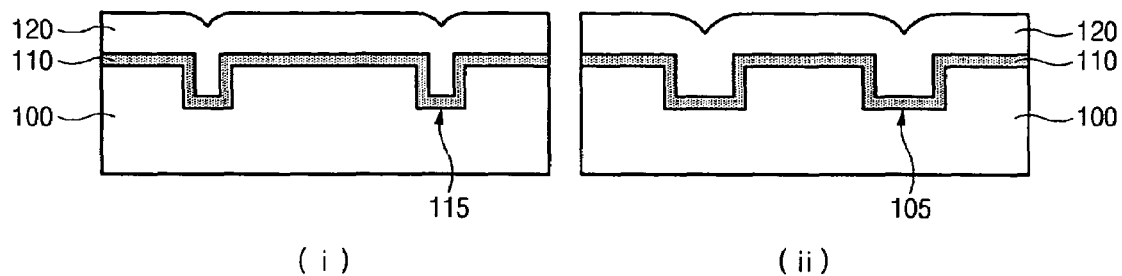

Referring to FIG. 3b, a gate oxide film 110 having a predetermined thickness is formed over the surface of the semiconductor substrate 100. Referring to FIG. 3c, a gate polysilicon layer 120 is formed to fill the recess gate region 105 and the overlay vernier region 115. The gate polysilicon layer 120 formed over the recess gate region 105 and the overlay vernier region 115. A depression or groove is formed in each of the regions 105 and 115.

Figure 3D:
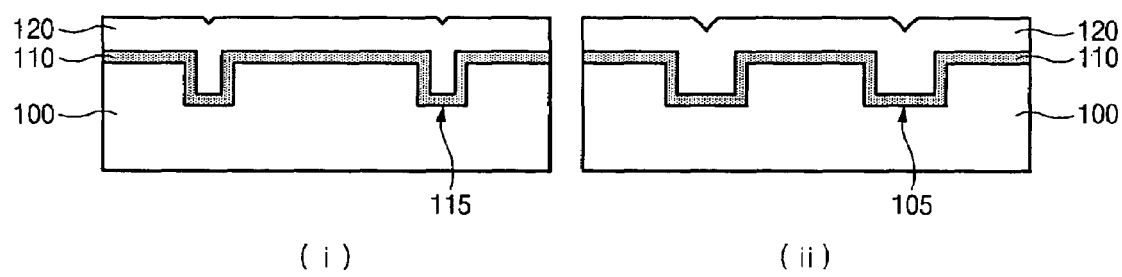

Referring to FIG. 3d, a chemical mechanical polishing (CMP) process is performed to planarize the surface of the gate polysilicon layer. However, the depression of the gate polysilicon layer 120 is not completely removed by the CMP process.

Figure 3E:
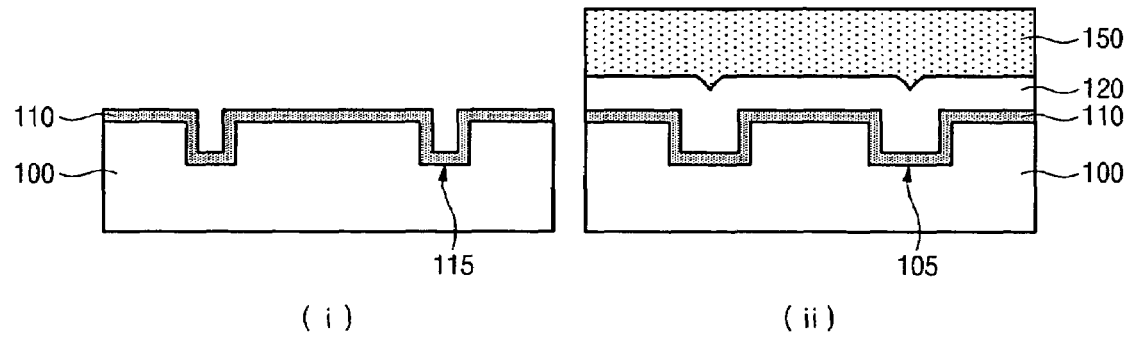

Referring to FIG. 3e, a key open mask (or mask) 150 which is formed to cover the cell region and expose the overlay vernier region 115. The mask is formed using photoresist material in the present embodiment. The gate polysilicon layer 120 of the overlay vernier region 115 is etched away using the key open mask 150. An etch gas having a high etching selectivity of the gate polysilicon layer 120 over the gate oxide film 110 is used to remove the gate polysilicon layer 120 but not the gate oxide film 110. The step difference of the overlay vernier region is maintained by removing the gate polysilicon layer 120 in the overlay vernier region 115, and the boundary becomes clear and is symmetrically formed.

Figure 3F:
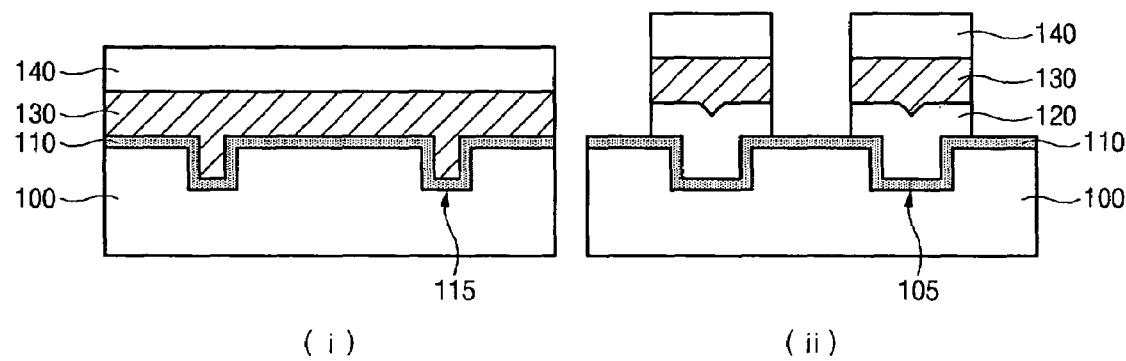

Referring to FIG. 3f, a gate metal layer 130 and a gate hard mask layer 140 are formed over the surface of the resulting structure. Then, an alignment process is performed using the step difference of the overlay vernier region 115 to align the gate mask. Thereafter, the gate hard mask layer 140, the gate metal layer 130 and the gate polysilicon layer 120 of the cell region are etched to form a gate.

Figure 4A:
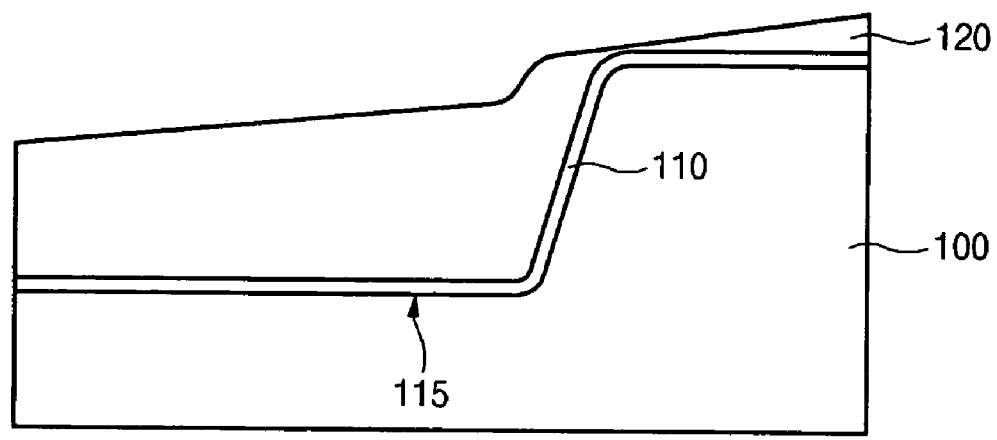
FIGS. 4a and 4b are cross-sectional diagrams illustrating a method for manufacturing a semiconductor device according to an embodiment of the present invention.
Figure 4B:
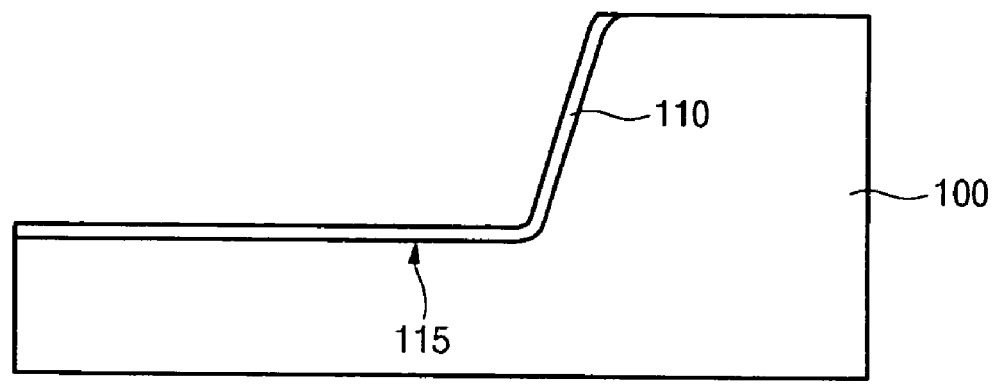

FIGS. 4a and 4b are cross-sectional diagrams illustrating a method for manufacturing a semiconductor device according to another embodiment of the present invention. FIGS. 4a and 4b show the enlarged overlay vernier region 115.

FIG. 4a illustrates the overlay vernier region 115 has the gate polysilicon layer 120 formed thereon. After the key open mask 150 (not shown in FIG. 4a) is formed exposing the gate polysilicon layer 120 in the overlay vernier region 115, a first etching process is performed to remove a portion of the gate polysilicon layer 120 over the overlay vernier region 115. The first etch process involves the use of a pressure ranging from 0 to 10 mT, a source power ranging from 300 to 1500 W, a bias power ranging from 100 to 1000 W. The first etching process is performing using a $CF_4$ gas, a $Cl_2$ gas or combination thereof. Referring to FIG. 4b, a second etching process is performed to remove the gate polysilicon layer 120 remaining in on the overlay vernier region 115. The second etch process has a high selectivity to the polysilicon than the oxide. The second etch process involves the use of a pressure ranging from 5 to 50 mT, a source power ranging from 300 to 2500 W, a bias power ranging from 10 to 500 W, HBr gas, and $O_2$ gas. In one implementation, the source power of the second etching process is 5 times larger than the bias power, and the amount of HBr gas used is 20~70 times more than that of $O_2$ gas. Here, the etching selectivity ratio of the gate polysilicon layer to the gate oxide film in the second etching process is 50:1 to 150:1.

The first and the second etching processes are performed using either CCP (Capacitively Coupled Plasma), ICP (Inductively Coupled Plasma), MERIE (Magnetically Enhanced Reactive Ion Etcher) plasma, or Microwave Source plasma.

Figure 5A:
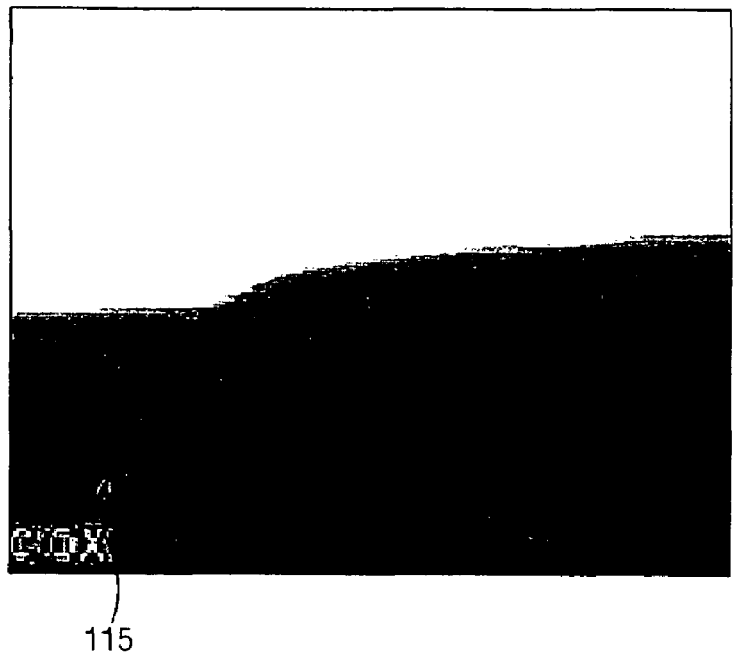
FIGS. 5a and 5b are cross-sectional images corresponding to FIGS. 4a and 4b.

FIG. 5a illustrates the overlay vernier region 115 after the first etching process, where the polysilicon layer 120 is partly removed. The etch selectivity of oxide film:polysilicon:organic materials generated from the etching process is 1:1:1. The gate polysilicon layer 120 can be etched to a depth of 300 to 400Å from the surface of the structure.

Figure 5B:
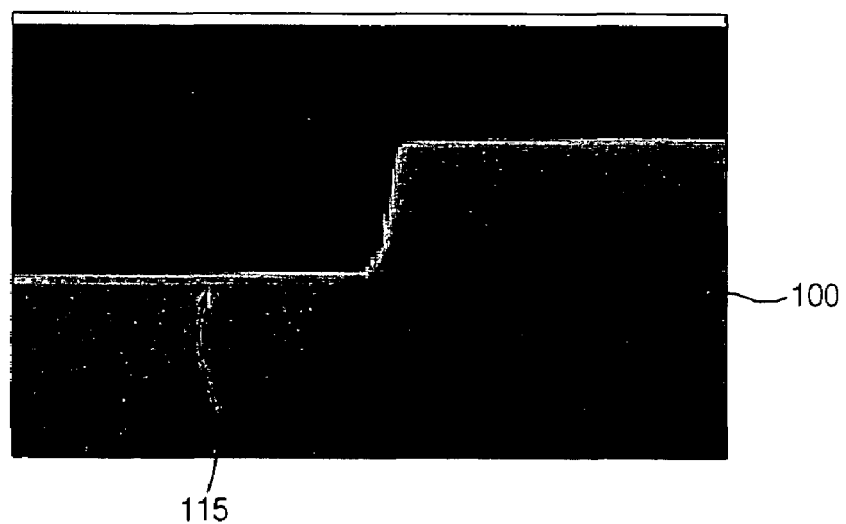

Referring to FIG. 5b, the second etching process is performed to remove the residual gate polysilicon layer 120. The second etching process may also be used to etch the gate polysilicon layer 130 in the cell region to form the gate. The second etching process has high selectivity to the polysilicon with respect to the oxide, so that the substrate 100 would not be etched.

As described above, the method for manufacturing a semiconductor device according to an embodiment of the present invention includes performing the first etching process with the key open mask to etch the top portion of the gate polysilicon layer under a pressure ranging from 0 to 10 mT, a source power ranging from 300 to 1500 W and a bottom power ranging from 100 to 1000 W. The first etching process is performing using a $CF_4$ gas, a $Cl_2$ gas or combination thereof. Then performing the second etching process to etch the residual gate polysilicon layer and the gate oxide film over the semiconductor substrate under a pressure ranging from 5 to 50 mT, a source power ranging from 300 to 2500 W and a bottom power ranging from 10 to 500 W using an etch gas including HBr and $O_2$.

As a result, the overlay vernier may be formed to have a clear step difference for ease of alignment, and the overlay of the arrangement of wafer to wafer and lot to lot may be improved, thereby increasing reliability of semiconductor devices, improving process yield and reproducibility of semiconductor devices.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device, the method comprising:
    etching a semiconductor substrate to form a recess gate region and an overlay vernier region;
    forming a gate oxide film over the recess gate region and the overlay vernier region of the semiconductor substrate;
    forming a polysilicon layer which fills the recess gate region and the overlay vernier region;
    removing the polysilicon layer formed over the overlay vernier region but not the polysilicon layer formed over the recess gate region;
    depositing a gate conductive layer over the overlay vernier region and the polysilicon layer remaining over the recess gate region; and
    aligning a gate mask using the overlay vernier region to etch the gate conductive layer to form a gate.

2. The method according to claim 1, wherein the removing step includes a dry etching process with a key open mask which exposes the polysilicon layer over the overlay vernier region.

3. The method according to claim 1, wherein the removing step comprises:
    forming a key open mask which exposes the polysilicon layer provided over the overlay vernier region; and
    performing an etch process to remove the polysilicon layer over the overlay vernier region, wherein a step difference is created between the overlay vernier region and the recess gate region.

4. The method of claim 3, wherein the etch process is performed until the gate oxide film provided over the overlay vernier is substantially exposed.

5. The method of claim 3, wherein the etch process includes: a first etch process performed under a pressure ranging from 0 to 10 mT and using a source power ranging from 300 to 1500 W, a bias power ranging from 100 to 1000 W, and a first etch gas including $CF_4$, and
    a second etch process performed under a pressure ranging from 5 to 50 mT and using a source power ranging from 300 to 2500 W, a bias power ranging from 10 to 500 W, and a second etch gate including HBr.

6. The method of claim 5, wherein the first etch gas includes $CF_4$ and $Cl_2$ gas.

7. The method of claim 6, wherein the second etch gas includes $O_2$ gas.

8. The method according to claim 3, wherein the etch process uses one selected from the group consist of CCP (Capacitively Coupled Plasma), ICP (Inductively Coupled Plasma), MERIE (Magnetically Enhanced Reactive Ion Etcher) plasma and Microwave Source plasma.

9. The method according to claim 5, wherein, during the second etch process, the source power is at least 5 times larger than the bias power.

10. The method according to claim 7, wherein an amount of HBr gas used in the second etch process is 20~70 times more than $O_2$ gas.

11. The method according to claim 3, wherein the etch selectivity of the polysilicon layer: the gate oxide film is 50:1 to 150:1.

12. A method for manufacturing a semiconductor device having an active region and an overlay vernier region, the method comprising:

etching a semiconductor substrate to form a trench in the overlay vernier region;

forming a gate oxide film over the active region and the overlay vernier region;

forming a polysilicon layer over the overlay vernier region and the active region, the polysilicon layer filling the trench;

removing the polysilicon layer formed over the overlay vernier region but not the polysilicon layer formed over the active region in order to make a step difference between the overlay vernier region and the active region;

depositing a gate conductive layer over the polysilicon layer remaining over the active region; and aligning a gate mask using the overlay vernier region to etch the gate conductive layer to form a gate.

13. The method of claim 12, wherein the trench formed in the overlay vernier region is used to align the gate mask.

* * * * *